United States Patent
Kubo et al.

(10) Patent No.: US 12,040,112 B2
(45) Date of Patent: Jul. 16, 2024

(54) MAGNETIC SHEET, COIL MODULE HAVING MAGNETIC SHEET, AND NON-CONTACT POWER SUPPLY DEVICE

(71) Applicant: TDK CORPORATION, Tokyo (JP)

(72) Inventors: Yoshihiro Kubo, Tokyo (JP); Yoshito Oka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 881 days.

(21) Appl. No.: 16/953,590

(22) Filed: Nov. 20, 2020

(65) Prior Publication Data
US 2021/0183549 A1 Jun. 17, 2021

(30) Foreign Application Priority Data
Dec. 11, 2019 (JP) .................... 2019-223822

(51) Int. Cl.
| H01F 1/34 | (2006.01) |
| C04B 35/26 | (2006.01) |
| C04B 35/626 | (2006.01) |
| C04B 35/63 | (2006.01) |
| C04B 35/64 | (2006.01) |

(Continued)

(52) U.S. Cl.
CPC ......... *H01F 1/342* (2013.01); *C04B 35/2658* (2013.01); *C04B 35/6262* (2013.01); *C04B 35/63* (2013.01); *C04B 35/64* (2013.01); *C04B 2235/3239* (2013.01); *C04B 2235/3251* (2013.01); *C04B 2235/3274* (2013.01); *C04B 2235/3418* (2013.01); *C04B 2235/442* (2013.01); *C04B 2235/5436* (2013.01); *C04B 2235/6025* (2013.01); *C04B 2235/6567* (2013.01); *H01F 27/245* (2013.01); *H02J 50/10* (2016.02)

(58) Field of Classification Search
None
See application file for complete search history.

(56) References Cited

U.S. PATENT DOCUMENTS

2014/0306656 A1* 10/2014 Tabata .................... H02J 50/12
                                                                320/108

FOREIGN PATENT DOCUMENTS

| CN | 203910505 U | 10/2014 |
| JP | H04-306809 A | 10/1992 |

(Continued)

OTHER PUBLICATIONS

Zapata et al., "Effect of zinc concentration on the microstructure and relaxation frequency of Mn—Zn ferrites synthesized by solid state reaction", Ceramics International, vol. 39, 2013, pp. 7853-7860 (Year: 2013).*

*Primary Examiner* — Holly Rickman
(74) *Attorney, Agent, or Firm* — Oliff PLC

(57) ABSTRACT

A magnetic sheet according to the present invention contains Mn—Zn ferrite as a main component and is comprised of a sheet-shaped sintered body. Besides, a ratio of $Z_{MIN}$ to $Z_{MAX}$ ($Z_{MIN}/Z_{MAX} \times 100$) is 90% or more, in which a maximum value of a content of Zn in terms of oxide is set to $Z_{MAX}$ and a minimum value of the content of Zn in terms of oxide is set to $Z_{MIN}$ in a thickness direction of a cross section of the sintered body.

19 Claims, 5 Drawing Sheets

(51) Int. Cl.
*H01F 27/245* (2006.01)
*H02J 50/10* (2016.01)

(56) References Cited

FOREIGN PATENT DOCUMENTS

| | | |
|---|---|---|
| JP | 2012-069869 A | 4/2012 |
| JP | 2013-093989 A | 5/2013 |
| JP | 2016-012656 A | 1/2016 |

* cited by examiner

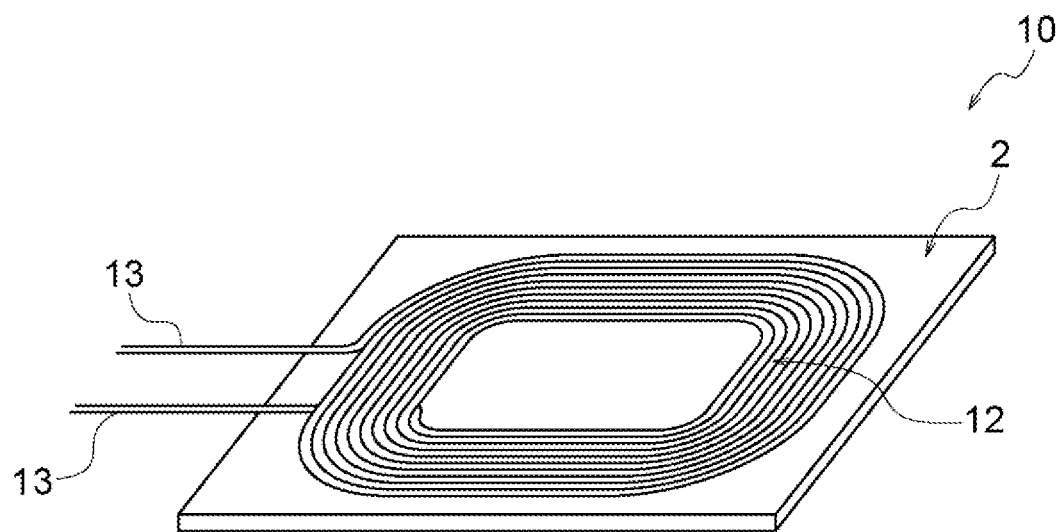
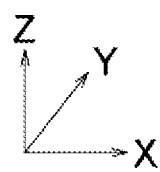
FIG. 4

MAGNETIC SHEET, COIL MODULE HAVING MAGNETIC SHEET, AND NON-CONTACT POWER SUPPLY DEVICE

BACKGROUND OF THE INVENTION

The present invention relates to a magnetic sheet comprised of Mn—Zn ferrite, a coil module having the magnetic sheet, and a non-contact power supply device.

Conventionally, magnetic sheets containing ferrite have been used in fields such as short-range wireless communication, wireless power transmission, electromagnetic wave protection, or the like for the purpose of electromagnetic wave blocking, electromagnetic wave absorption, magnetic wave line convergence, or the like.

Such a magnetic sheet is manufactured by firing a green sheet containing ferrite powder on a ceramic setter. However, the ferrite sheet obtained as a sintered body, is highly brittle, and therefore physical damage such as cracks is prone to occur. In addition, when the thickness of the ferrite sheet is thin, deformation is prone to occur after firing, and it is difficult to stably manufacture the ferrite sheet. Cracks or deformation occurred in the magnetic sheet may result in deterioration in mechanical strength or magnetic characteristics.

To address the above problems, Japanese Patent Laid-Open No. 2016-12656 realizes stable manufacturing by preparing the composition and a grain growth inhibitor in a magnetic sheet composed of Ni—Zn ferrite. However, the invention disclosed in Japanese Patent Laid-Open No. 2016-12656 is merely a technique applied to Ni—Zn ferrite, and cannot suppress the occurrence of cracks or deformation when applied to Mn—Zn ferrite.

Although Mn—Zn ferrite has better magnetic characteristics than Ni—Zn ferrite, it is extremely difficult to manufacture because accurate atmosphere control is required during firing. In particular, when the thickness of the magnetic sheet is thin, the manufacturing difficulty increases, and defects such as cracks and deformation are more prone to occur after firing.

BRIEF SUMMARY OF INVENTION

The present invention has been attained in view of above situation, and the object is to provide a magnetic sheet which can be stably manufactured and has excellent magnetic characteristics, a coil module having the magnetic sheet, and a non-contact power supply device.

In order to attain the above object, the magnetic sheet according to the present invention include a sheet-shaped sintered body, the sintered body contains Mn—Zn ferrite as a main component, and a ratio of $Z_{MIN}$ to $Z_{MAX}$ ($Z_{MIN}/Z_{MAX} \times 100$) is 90% or more, in which a maximum value of a content of Zn in terms of oxide is set to $Z_{MAX}$ and a minimum value of the content of Zn in terms of oxide is set to $Z_{MIN}$ in a thickness direction of a cross section of the sintered body.

As a result of intensive studies, the present inventors have found that the magnetic sheet of the present invention having the above-mentioned characteristics can be industrially and stably manufactured. In addition, the magnetic sheet according to the present invention has excellent magnetic characteristics (initial permeability and magnetic loss).

In particular, the magnetic sheet according to the present invention can be industrially and stably manufactured even when the magnetic sheet is made thin, and an average thickness of the sintered body can be set to 2500 μm or less.

In addition, preferably, a standard deviation of the content of Zn in terms of oxide is 0.3 mol % or less in the thickness direction of the cross section of the sintered body.

The magnetic sheet according to the present invention can be manufactured by, for example, a manufacturing method shown below. That is, the method for manufacturing the magnetic sheet according to the present invention includes a firing step in which a green sheet containing ferrite powder is mounted on a setter and sintered. Besides, a porosity of the setter used in the firing step is preferably less than 30%, and more preferably 4% to 27.5%. In addition, an arithmetic mean roughness (Ra) of the surface of the setter is preferably 2.0 μm or less, and more preferably 1.5 μm or less.

In addition, in the above firing step, a maximum oxygen concentration of an atmosphere in a furnace is preferably controlled to 6.0 vol % or less, and more preferably controlled to a range of 0.5 vol % to 6.0 vol %. In particular, it is preferable that the maximum oxygen concentration is controlled within the above range not only in a temperature holding process, but also in a temperature rising process from 900° C. to the holding temperature, and a temperature lowering process from the holding temperature to 900° C.

The magnetic sheet according to the present invention can be used in fields such as short-range wireless communication, wireless power transmission, electromagnetic wave protection, and the like. In particular, the magnetic sheet according to the present invention can be preferably used as a constituent of a coil module in a non-contact power supply device.

BRIEF DESCRIPTION OF DRAWINGS

FIG. 4 is a schematic perspective view showing a coil module according to an embodiment of the present invention.

DETAILED DESCRIPTION OF INVENTION

Hereinafter, the present invention is described in detail based on the embodiments shown in the figures.

First Embodiment

In the first embodiment, a magnetic sheet 2 according to an embodiment of the present invention is described with reference to FIGS. 1 to 3. The magnetic sheet 2 of the present embodiment is comprised of a sheet-shaped ferrite sintered body.

A shape of the magnetic sheet 2 in a plan-view is not particularly limited, and may be, for example, a circular shape, an elliptical shape, a rectangle shape, a polygonal shape, or the like. The shape is appropriately determined according to the use of the magnetic sheet 2. A dimension of the magnetic sheet 2 in the plan view is not particularly limited either, and the area of a front surface 2a or a back surface 2b can be set to 2000 mm² or more, and preferably 5000 mm² to 10000 mm².

Figure 1:
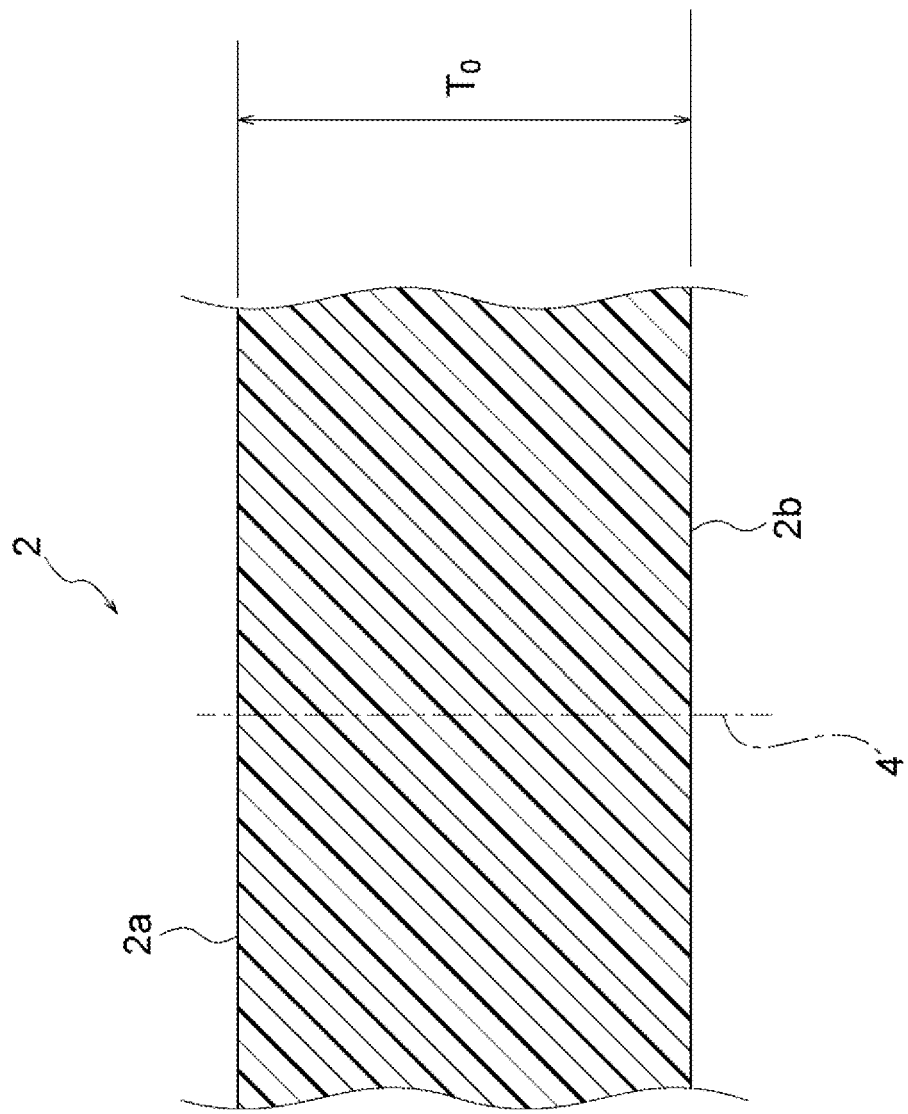
FIG. 1 is a schematic cross-sectional view of a magnetic sheet according to an embodiment of the present invention.

On the other hand, an average thickness T0 of the magnetic sheet 2 shown in FIG. 1 can be set to 2500 µm or less, preferably 50 µm to 2500 µm, more preferably 100 µm to 2000 µm, and further preferably 100 µm to 1000 µm. The thickness T0 of the magnetic sheet 2 is obtained by image analysis of a cross section as shown in FIG. 1, and it is preferable to measure at least 5 points or more and calculate the average value thereof as the thickness T0.

Moreover, because the magnetic sheet 2 can have the above-mentioned dimensions, the ratio (area/volume) of an area of the front surface 2a or the back surface 2b to a volume of the magnetic sheet 2 can be set to 0.4 $mm^{-1}$ or more, preferably 0.5 $mm^{-1}$ or more, and more preferably 1 $mm^{-1}$ or more.

The magnetic sheet 2 of the present embodiment contains Mn—Zn ferrite as a main component. The Mn—Zn ferrite preferably contains iron oxide in an amount of 51 to 58 mol % in terms of $Fe_2O_3$, zinc oxide in an amount of 3 to 18 mol % in terms of ZnO, and the balance is composed of manganese oxide (MnO). The magnetic sheet 2 of the present embodiment has excellent magnetic characteristics by forming the Mn—Zn ferrite being the main component with the above composition.

In addition, the magnetic sheet 2 can contain a subcomponent in addition to the above-mentioned main component. The subcomponent includes, for example, zirconium oxide ($ZrO_2$), silicon oxide ($SiO_2$), calcium oxide (CaO), niobium oxide ($Nb_2O_5$), vanadium oxide ($V_2O_5$), tantalum oxide ($Ta_2O_5$), nickel oxide (NiO), titanium oxide ($TiO_2$), tin oxide ($SnO_2$), cobalt oxide (CoO), and the like. The subcomponent may be one selected from the above oxides, or a combination of a plurality of the above oxides.

Moreover, in the above description, the content of each subcomponent is preferably within a range shown below with respect to 100 parts by weight of the main component. That is, zirconium oxide is 0.005 to 0.04 part by weight in terms of $ZrO_2$, silicon oxide is 0.005 to 0.02 part by weight in terms of $SiO_2$, calcium oxide is 0.02 to 0.2 part by weight in terms of CaO, niobium oxide is 0.005 to 0.075 part by weight in terms of $Nb_2O_5$, vanadium oxide is 0.005 to 0.05 part by weight in terms of $V_2O_5$, tantalum oxide is 0.005 to 0.15 part by weight in terms of $Ta_2O_5$, nickel oxide is 0.05 to 1 part by weight in terms of NiO, titanium oxide is 0.01 to 0.6 part by weight in terms of $TiO_2$, tin oxide is 0.05 to 0.8 part by weight in terms of $SnO_2$, and cobalt oxide is 0.02 to 0.4 part by weight in terms of CoO. By containing the subcomponents in the above range, the magnetic characteristics can be further improved.

Besides, in addition to the above-mentioned oxide subcomponent, the magnetic sheet 2 may also contain a metal component or a compound containing a typical element or a transition metal element as shown below. The typical element includes boron (B), carbon (C), phosphorus (P), sulfur (S), chlorine (Cl), arsenic (As), selenium (Se), bromine (Br), tellurium (Te), iodine (I), lithium (Li), sodium (Na), magnesium (Mg), aluminum (Al), potassium (K), gallium (Ga), germanium (Ge), strontium (Sr), cadmium (Cd), indium (In), tin (Sn), antimony (Sb), barium (Ba), lead (Pb), bismuth (Bi), and the like. On the other hand, the transition metal elements includes scandium (Sc), titanium (Ti), chromium (Cr), nickel (Ni), copper (Cu), yttrium (Y), zirconium (Zr), molybdenum (Mo), palladium (Pd), silver (Ag), hafnium (Hf), tantalum (Ta), and the like. The content of the metal component or the compound is not particularly limited, and is preferably in the range of about 0.0001 to 0.1 parts by weight with respect to 100 parts by weight of the main component. The subcomponent of the metal component or the compound may be intentionally added, or may be contained as an inevitable impurity in raw materials.

The contents of the main component and the subcomponent of the magnetic sheet 2 can be measured by various analysis methods such as component analysis by electron probe microanalyzer (EPMA), composition analysis by X-ray diffraction (XRD) or electron diffraction (ED), and various ICP analysis methods including laser ablation-inductively coupled plasma-mass spectrometry (LA-ICP-MS), and the analysis method is not particularly limited. Preferably, the content ratio of oxides (iron oxide, zinc oxide, and manganese oxide) constituting the main component is analyzed by EPMA.

Note that, as described above, the magnetic sheet 2 of the present embodiment is a sheet-shaped sintered body, and thus the inside of the magnetic sheet 2 is substantially free of resin components. "Substantially free" of resin components means that the resin component is 40 ppm by weight or less with respect to 100% by weight of the main component. It should be note that, a magnetic sheet containing a resin is more flexible than a sintered sheet, but tends to be inferior in magnetic characteristics such as magnetic permeability.

Specifically, as the characteristics of the magnetic sheet 2 being a sintered body, an initial permeability µi is preferably 1800 or more, more preferably 2000 or more, and further preferably 2200 or more. In addition, the magnetic loss (core loss) of the magnetic sheet 2 is preferably 1000 $kW/m^3$ or less, more preferably 800 $kW/m^3$ or less, and further preferably 600 $kW/m^3$ or less.

The magnetic sheet 2 of the present embodiment is characterized in that the variation of the Zn component at the thickness direction is controlled within a predetermined range in an arbitrary cross section as shown in FIG. 1. Specifically, a ratio of $Z_{MIN}$ to $Z_{MAX}$ ($Z_{MIN}/Z_{MAX} \times 100$) is 90% or more, in which a maximum value of a content of Zn is set to $Z_{MAX}$ and a minimum value of the content of Zn is set to $Z_{MIN}$ in the thickness direction of an arbitrary cross section of the magnetic sheet 2.

In the above description, the arbitrary cross section of the magnetic sheet 2 is not particularly limited as long as it is a cross section in which the thickness direction (Z-axis direction) of the magnetic sheet 2 is exposed. However, preferably, the cross section for component analysis is an X-Z cross section or a Y-Z cross section at substantially the center of the X-Y plane of the magnetic sheet 2.

In addition, in the above description, the content of Zn is obtained by continuously analyzing the components along the thickness direction in the arbitrary cross section of the magnetic sheet 2, and the ratio of the Zn component in 100 mol % of the main component is expressed in terms of ZnO (in terms of oxide) (unit: mol %). In the present embodiment, the continuous component analysis is carried out by observing the cross section of the magnetic sheet 2 with a scanning electron microscope (SEM) or the like, and performing line analysis by EPMA at that time.

Figure 2:
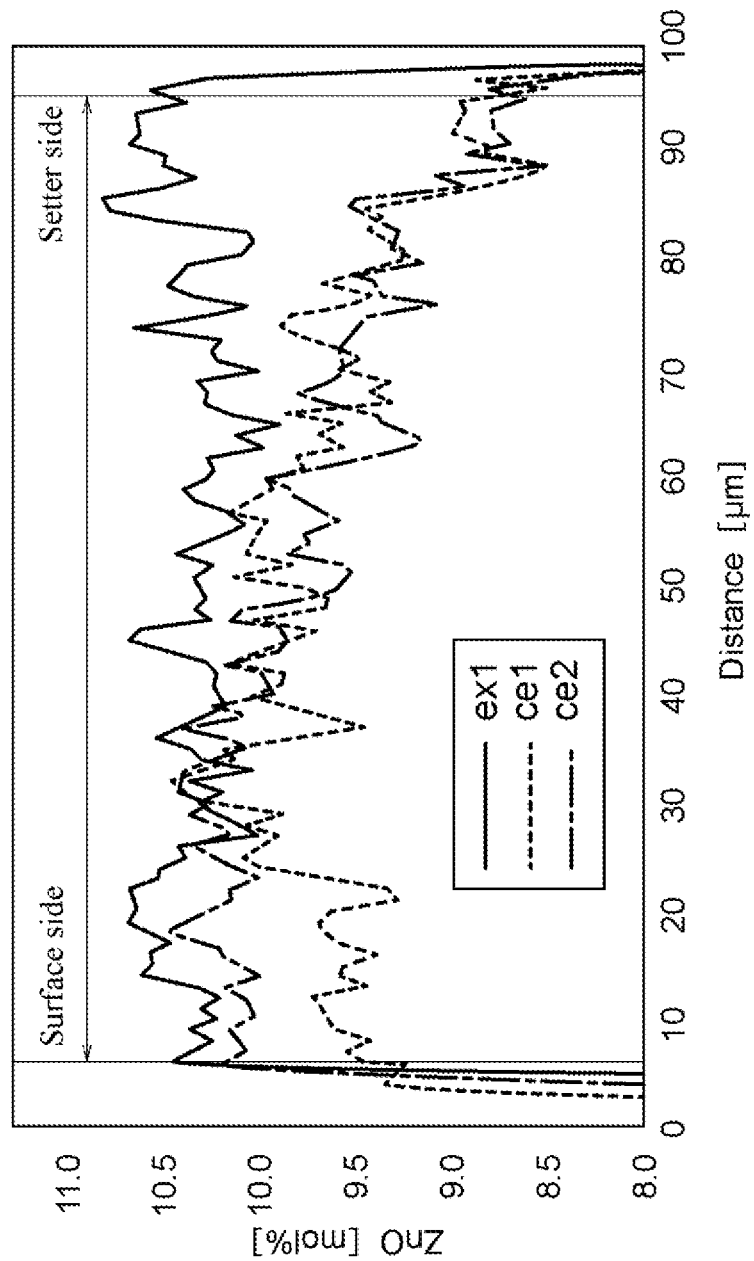
FIG. 2 is a graph showing the results of line analysis by EPMA.

FIG. 2 is a graph showing an example of the result of line analysis by EPMA. Specifically, in the line analysis, component analysis is performed at regular intervals of about 1 to 20 µm on a measurement line 4 (FIG. 1) along the thickness direction to obtain continuous data. For example, in the graph of FIG. 2, continuous data is plotted with the Y-axis representing the content of Zn in terms of ZnO, and a variation of the Zn component in the thickness direction is shown. Besides, in the continuous data as shown in FIG. 2, the maximum value is $Z_{MAX}$ and the minimum value is $Z_{MIN}$.

As shown by the solid line (ext) in FIG. 2, in the magnetic sheet 2 of the present embodiment, the variation of the Zn component in the thickness direction is limited to a small range. Specifically, a standard deviation of the content of Zn in the thickness direction is preferably 0.3 mol % or less. In addition, a ratio of $Z_A$ to $Z_T$ ($Z_A/Z_T$) is preferably about 0.94 to 1.02, in which a target value of the content of Zn calculated from the charged amounts of the raw material powders is $Z_T$ and an average value of the continuous data obtained by the line analysis is $Z_A$.

Note that, in the line analysis by EPMA, it is difficult to perform accurate component analysis at an end edge on the front surface 2a side and an end edge on the back surface 2b side, which are the edge portions of the measurement sample. Therefore, regarding the continuous data used for analysis of each data ($Z_{MAX}$, $Z_{MIN}$, $Z_A$), the data within a range of about 3 to 5 µm from the end edge of the front surface 2a and the back surface 2b is removed (ignored) from the entire range of data obtained by the line analysis. For example, when the thickness of the magnetic sheet 2 is 100 first, component analysis is performed at an interval of 1 µm on the measurement line 4 to acquire continuous data. Then, as shown in FIG. 2, the data within a range of 5 µm from the end edge of the front surface 2a (distance is in a range of 0 to 5 µm) and the data within a range of 5 µm from the end edge of the back surface 2b (distance is in a range of 95 to 100 µm) is removed from the continuous data, and data analysis is performed.

Next, an example of the method for manufacturing the magnetic sheet 2 shown in FIG. 1 is described.

First, a ferrite raw material constituting the magnetic sheet 2 is prepared. Specifically, the raw material of the main component and the raw material of the subcomponent are weighed so as to have the above-mentioned predetermined composition ratio and then mixed to obtain a raw material mixture. The mixing method is not particularly limited, and may include wet mixing with a ball mill and dry mixing with a dry mixer. Moreover, the average particle size of each raw material is preferably about 0.1 to 3 µm.

Iron oxide ($\alpha$-$Fe_2O_3$), zinc oxide (ZnO), manganese oxide ($Mn_3O_4$), or a composite oxide thereof can be used as the raw material of the main component. In addition, various compounds that become the above oxides or composite oxides by firing can also be used. The compound that becomes the above oxide by firing includes a metal simple substance, carbonate, oxalate, nitrate, hydroxide, halide, an organic metal compound, and the like. Moreover, although the content of manganese oxide in the main component is converted in terms of MnO, $Mn_3O_4$ is preferably used as the raw material.

In addition, similar to the main component, not only an oxide but also a composite oxide or a compound which becomes an oxide after firing can be used as the raw material of the subcomponent. Alternatively, the raw material of the subcomponent may be added in the first mixing step as described above, or may be added after a calcination step described later.

Next, the raw material mixture obtained in the above mixing step is calcined to obtain a calcined material. As the conditions for this calcination, it is preferable that the holding temperature is 800 to 1100° C., and the holding time is 1 to 3 hours. In addition, the processing atmosphere during calcination may be an air atmosphere or an atmosphere having a higher oxygen partial pressure than in the air atmosphere.

After the calcination step, the calcined material is pulverized to obtain the pulverized material. The pulverization is performed in order to break the agglomeration of the calcined material and obtain powder having appropriate sinterability. When the calcined material forms a large lump, it is preferable to perform coarse crush and then perform wet pulverization using a ball mill, an attritor, or the like. In addition, an average particle size of the pulverized material is preferably about 0.1 to 2 µm.

Subsequently, a sheet-shaped molded body (green sheet) is manufactured using the pulverized material obtained in the previous step. The method for obtaining the green sheet is not particularly limited, and may include various molding methods such as a doctor blade method, extrusion molding, powder compression molding, and the like. For example, it is preferable to perform molding using the doctor blade method when the average thickness T0 of the magnetic sheet 2 is 300 µm or less, and perform extrusion molding when the average thickness T0 is 300 µm or more.

To obtain the green sheet using the doctor blade method, first, the pulverized material is kneaded together with a binder, a solvent, a dispersant, or the like to obtain a ferrite paste. The type and the content of the binder, the solvent, or the like in the ferrite paste are optional, and known specifications can be adopted. Then, the ferrite paste is applied onto a carrier tape to form a sheet and thereby obtain a green sheet.

On the other hand, to obtain the green sheet using extrusion molding, first, the pulverized material is kneaded together with a binder to obtain a ferrite kneaded soil. The type and the content of the binder used at this time are optional, and known specifications can be adopted. Then, a green sheet is obtained by introducing this ferrite kneaded soil into a mold of an extruder, applying pressure to the ferrite kneaded soil while appropriately heating it and extruding it through a gap having a predetermined cross-sectional shape.

The magnetic sheet 2 can be obtained by appropriately drying the green sheet obtained in the above step and punching it to obtain product dimensions, and then firing the green sheet. As shown in FIG. 3, in the firing step, after a green sheet 3 is mounted on a setter 6 and the setter 6 is put into a firing furnace, the green sheet 3 is sintered by heating the setter while controlling the atmosphere inside the furnace and the temperature inside the furnace. In the manufacture of the magnetic sheet 2 according to the present embodiment, firing is a key step. In particular, the variation of the Zn component in the cross section of the magnetic sheet 2 is controlled by adjusting various conditions such as the holding temperature, the holding time, the oxygen partial pressure in the atmosphere during firing, and the characteristics of the setter used. Hereinafter, preferable firing conditions are described.

First, as the setter 6, ceramic materials such as alumina ($Al_2O_3$), zirconia ($ZrO_2$), mullite ($3Al_2O_3/2SiO_2$-$2Al_2O_3/SiO_2$) and the like can be used, and it is preferable to use high-purity alumina having a purity of 99% or more. In addition, the setter 6 is preferably denser and smoother. Specifically, the porosity of the setter 6 is preferably less than 30%, and more preferably 4% to 27.5%. Besides, the surface roughness of the setter 6 is preferably 2.0 µm or less, and more preferably 1.5 µm or less, in terms of arithmetic average roughness Ra. As described above, the reduction of the Zn component particularly in the vicinity of the back surface 2b of the magnetic sheet 2 can be suppressed by using the setter 6 which is dense and has a smooth surface 6a.

In addition, the firing furnace may be any furnace that can control the atmosphere inside the furnace, and a batch type firing furnace or a continuous type firing furnace can be used. Besides, the holding temperature during firing is preferably 1150° C. to 1300° C., and the holding time is preferably 0.5 to 3 hours. Moreover, in the above description, the holding temperature means a temperature at which the material temperature (the temperature of the sheet itself) is stable at the highest point.

Furthermore, the oxygen partial pressure is controlled so that the maximum oxygen concentration in the atmosphere inside the furnace is preferably 6.0 vol % or less, and more preferably 0.5 vol % to 6.0 vol %. In particular, in the present embodiment, it is preferable that the oxygen partial pressure is controlled so that the oxygen concentration is within the above range not only in a temperature holding process, but also in a temperature rising process from 900° C. to the holding temperature and a temperature lowering process from the holding temperature to 900° C. The reduction of the Zn component particularly in the vicinity of the front surface 2a of the magnetic sheet 2 can be suppressed by controlling the temperature and the atmosphere during firing as described above.

Alternatively, in addition to the above-mentioned conditions, a treatment for increasing the vapor pressure of zinc in the atmosphere may be carried out during firing. The treatment includes, for example, a treatment of placing a block of zinc oxide on the setter 6, a treatment of covering a front surface 3a of the green sheet 3 with zinc oxide powder, a treatment of covering the green sheet 3 being a product with a ferrite box and firing, and the like.

Figure 3:
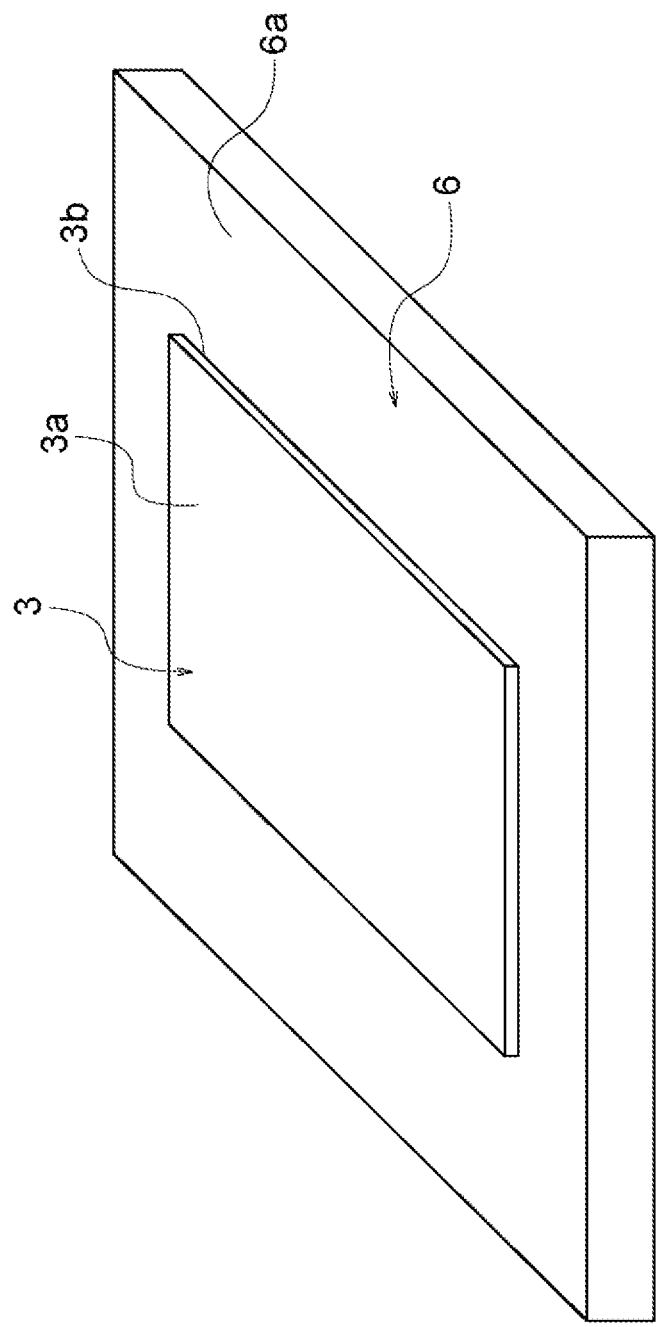
FIG. 3 is a schematic perspective view showing a mounted state of the magnetic sheet in a firing step.

In addition, in FIG. 3, one green sheet 3 is mounted on one setter 6. Alternatively, a plurality of green sheets 3 may be mounted at the same time. However, when a plurality of green sheets 3 are mounted at the same time, it is preferable that the plurality of green sheets 3 are arranged side by side on the X-Y plane instead of being laminated in the Z axis. The reason is that in the case of Mn—Zn ferrite, the plurality of green sheets may be fused to each other when they are laminated and fired.

Furthermore, a protective layer may be formed on the front surface 2a or/and the back surface 2b (the back surface 2b is the surface that is in contact with the setter 6) after the fired magnetic sheet 2 is removed from the setter 6. However, it is preferable that the surface 2a after firing and the back surface 2b after firing can be used as fired surfaces without performing machining such as blasting, polishing, cutting, or the like.

The above is the manufacturing method of the magnetic sheet 2 in the present embodiment. Moreover, in the manufacture of the magnetic sheet 2, the following processing may be performed in addition to the above steps. For example, the magnetic sheet 2 may be divided into multiple small pieces to improve impact resistance. In this case, the green sheet 3 before firing is precut to form grid-like grooves. A resin film such as polyethylene terephthalate (PET) is laminated and attached to the front surface 2a and the back surface 2b of the magnetic sheet 2 obtained after firing the green sheet 3. Then, by applying a roller to the magnetic sheet 2 to which the film is attached, the magnetic sheet 2 is divided into regular small pieces while being sandwiched between the films.

Summary of the First Embodiment

The magnetic sheet 2 of the present embodiment is comprised of a sheet-shaped sintered body, and contains Mn—Zn ferrite as a main component. Besides, in the cross section of the magnetic sheet 2, the ratio ($Z_{MIN}/Z_{MAX} \times 100$) between the maximum value ($Z_{MAX}$) and the minimum value ($Z_{MIN}$) of the content of Zn in the thickness direction is 90% or more.

Conventionally, Mn—Zn ferrites have been practically used as massive ferrite cores of drum type, E type, I type, or the like, but it has been extremely difficult to put the Mn—Zn ferrites into practical use for a sheet. The reason is that in the case of the sheet shape, various defects occur in the manufacturing process, and it is difficult to manufacture by the conventional technique. The possible reasons are as follows.

For example, in the case of a sheet-shaped ferrite sintered body, because the ratio of the plane (area of the front surface 2a and the back surface 2b of the magnetic sheet 2) to the volume is large, deformation such as warpage or undulations and internal cracks are prone to occur after firing. In addition, in the case of the Mn—Zn ferrite sheet, fusion defects such as adhesion of the green sheet 3 to the setter 6 are prone to occur during the firing process.

In particular, fusion defect scarcely occurs in Ni—Zn ferrite and is a defect mode peculiar to Mn—Zn ferrite. The reason is considered to be that Ni—Zn ferrite can be fired in the air atmosphere, but Mn—Zn ferrite needs to be fired under low oxygen partial pressure in order to ensure magnetic characteristics. In addition, in the case of a massive ferrite core, even if an abnormal portion such as a deformed portion or a cracked portion is formed on the surface of the core, the abnormal portion can be removed by polishing or the like. However, in the case of a sheet-shaped ferrite sheet, because the thickness is thin, the abnormal portion cannot be removed by polishing or the like. The reason is that the sheet is damaged when machining is applied.

As a result of intensive studies on the above problems, the present inventors have found that the variation of the Zn component in the cross section of the magnetic sheet 2 are related to the degree of occurrence of various defects such as deformation defects, crack defects, and fusion defects. Besides, the present inventors have found that the degree of variation of the Zn component in the thickness direction of the magnetic sheet 2 can be controlled by the firing conditions, the characteristics of the setter 6 used during firing, or the like. Furthermore, the present inventors have found that when the magnetic sheet 2 has a ratio of the content of Zn ($Z_{MIN}/Z_{MAX} \times 100$) of 90% or more, the above-mentioned deformation defects, crack defects, fusion defects and the like can be suppressed in the manufacturing process and mass productivity is good.

The reason why the mass productivity is good is not exactly clear, and is considered to be related to the dezincification on the front surface 3a and the back surface 3b of the green sheet 3.

For example, it is considered that zinc oxide contained in the green sheet 3 is reduced to metallic zinc on the front surface 3a of the green sheet 3. Because metallic zinc has a lower sublimation temperature than zinc oxide, the generated metallic zinc easily volatilizes on the front surface 3a of the green sheet 3 (dezincification on the surface 3a), leading to cracks and deterioration of magnetic characteristics. In the present embodiment, the volatilization of the zinc component on the front surface 3a is suppressed by controlling the oxygen concentration in the atmosphere within a predetermined range not only in the temperature holding process but also in the temperature rising process and the temperature lowering process. As a result, it is considered that the occurrence of cracks and the deterioration of the magnetic characteristics are suppressed on the front surface 2a of the obtained magnetic sheet 2 without reducing the Zn component.

On the other hand, it is considered that on the back surface 3b of the green sheet 3, the zinc component on the green sheet 3 side diffuses into the setter 6 and reacts with the ceramic component of the setter 6 during firing (dezincification on the back surface 3b). When the dezincification occurs on the back surface 3b, the obtained magnetic sheet 2 and the setter 6 are fused, leading to defects such as deformation, cracks, breakage, and the like.

In general, it has been considered preferable to use a material having a rough surface and a high porosity (30% or more) as the setter 6 so as to reduce the contact area between the green sheet and the setter. However, according to the experiments of the present inventors, it becomes clear that the Zn component tends to decrease on the back surface 3b side when a setter having a high porosity and a rough surface is used. On the other hand, when the setter 6 having high denseness and smoothness is used as in the present embodiment, the Zn component is scarcely reduced on the back surface 3b side. It is considered that when the porosity of the setter is high and the surface is rough, the zinc component is easily diffused deep inside the setter, and the dezincification on the back surface 3b is promoted. On the other hand, it is considered that when the setter 6 has high denseness and smoothness, the diffusion of the zinc component is kept within a necessary minimum range on the outermost surface of the setter 6.

It is considered that the magnetic sheet 2 of the present embodiment has good mass productivity (that is, the magnetic sheet 2 can be industrially and stably manufactured) because the dezincification on the front surface 3a and the back surface 3b is suppressed in the manufacturing process based on the above principle.

Note that, it is considered that the dezincification on the front surface 2a can also be suppressed by firing a dummy member such as solid zinc oxide or powder, or a ferrite box together with the green sheet 3 to increase the vapor pressure of zinc in the atmosphere. In this method, zinc is preferentially volatilized from the dummy member, and the volatilization of the Zn component from the green sheet 3 side can thereby be suppressed to some extent. However, this method makes it difficult to keep the vapor pressure of zinc constant and is not suitable for mass production. On the other hand, the oxygen partial pressure can be controlled by adjusting the gas component introduced into the furnace, and thus is easier to control than the vapor pressure control of zinc. Therefore, in the method of controlling the oxygen partial pressure of the present embodiment, the dezincification on the front surface 3a can be preferably suppressed without simultaneously firing the dummy member.

In addition, conventionally, measures to prevent poor fusion to the setter 6 include a treatment of coating the surface 6a of the setter 6 with zinc oxide or zirconium oxide as a release agent, a treatment of pre-containing zinc oxide and zirconium oxide inside the setter 6, and the like. However, in the manufacture of a sheet-shaped ferrite sintered body such as the magnetic sheet 2, the above-mentioned conventional measures are insufficient. The reason is that when the ferrite sintered body has a sheet shape, the ratio of the area of the back surface 3b to the volume of the green sheet 3 is large, and the dezincification on the back surface 3b is activated. Additionally, deformation or defect occurs in the magnetic sheet 2 when zinc oxide or zirconium oxide is present on the surface 6a of the setter 6. Therefore, in the case of a thin magnetic sheet, reduction of fusion defects cannot be achieved by the above-mentioned conventional technique, but can be preferably realized by the manufacturing method of the present embodiment.

Further, in the magnetic sheet 2 of the present embodiment, as a result of the suppression of various defects as described above, deterioration of the magnetic characteristics has been avoided, thus enhancing the initial permeability and reducing the magnetic loss. In particular, the magnetic sheet 2 has good mass productivity and excellent magnetic characteristics even when the average thickness T0 is reduced to 2500 μm or less or the sheet area is widened to 2000 mm$^2$ or more. In other words, the magnetic sheet 2 of the present embodiment can be made thinner or wider.

The magnetic sheet 2 of the present embodiment can be mounted on a smartphone, a tablet, a non-contact IC card, or the like for electromagnetic wave blocking. In addition, the magnetic sheet 2 can also be used as a noise filter or an electromagnetic wave absorber, and further can be preferably used as a constituent of a non-contact power supply device by being incorporated in a coil module.

Second Embodiment

In a second embodiment, a coil module 10 (FIG. 4) and a non-contact power supply device 100 (FIG. 5) having the magnetic sheet 2 are described as an example of the use of the magnetic sheet 2 described in the first embodiment. Note that, the configuration in the second embodiment common to the first embodiment is designated by the similar signs, and the description thereof is omitted.

FIG. 4 is a schematic perspective view showing the coil module 10 according to the second embodiment. As shown in FIG. 4, the coil module 10 has the magnetic sheet 2 and a coil 12.

The coil 12 is a flat plate-shaped spiral coil. In FIG. 4, the outer edge shape of the coil 12 in a plan view is a rounded square shape, but the outer edge shape of the coil 12 is not limited thereto, and may be a circular shape, an elliptical shape, a polygonal shape, or the like.

In addition, the coil 12 is formed by winding a conductive wire such as an insulation-covered copper wire or aluminum wire in a plane and spiral shape. The cross-sectional shape of the conductive wire to be used is not particularly limited, and may be circular, elliptical, triangular, quadrangular, or the like. Note that, the method of forming the coil 12 is not limited to the above method; alternatively the coil 12 may also be formed by a thin film method. The thin film method is a method of forming a coil by, for example, metal foil, conductive paste, plating transfer, sputtering, vapor deposition, or screen printing.

In addition, as shown in FIG. 4, a pair of lead terminals 13 is electrically connected to the coil 12. The lead terminals 13 are formed by pulling out the front end and the rear end of the conductive wire constituting the coil 12 to the outside of the coil 12. Moreover, the pulled-out position of the lead terminal 13 is not particularly limited.

In the second embodiment, the coil 12 is formed on the magnetic sheet 2 described in the first embodiment via an adhesive layer (not shown) such as an adhesive or a double-sided tape. The thickness of the adhesive layer is not particularly limited, and can be, for example, 10 μm to 100 μm. Moreover, a resin film (not shown) may be formed as a protective layer on the front surface 2a and the back surface 2b of the magnetic sheet 2.

In addition, the coil module 10 may have an alignment magnet in addition to the above-mentioned constituents. The alignment magnet is placed at, for example, the center of the coil 12. Furthermore, in FIG. 4, the coil module 10 is shown to have a single coil 12. However, the coil module 10 may also be a coil array type module formed by combining a plurality of coils 12.

Figure 5:
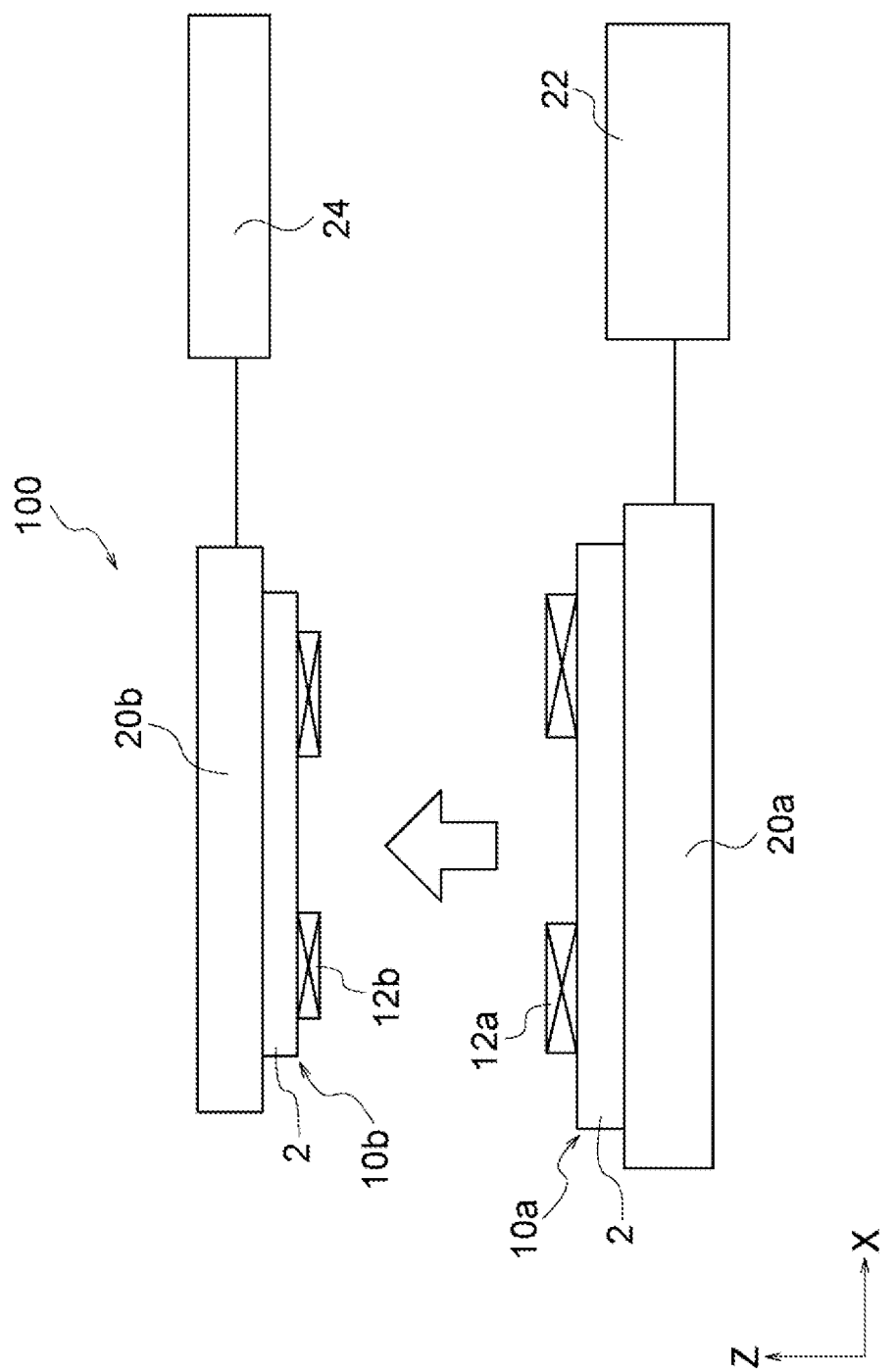
FIG. 5 is a schematic view showing a non-contact power supply device according to an embodiment of the present invention.

The coil module 10 having the magnetic sheet 2 is preferably used in the non-contact power supply device 100 as shown in FIG. 5. Hereinafter, the non-contact power supply device 100 according to the second embodiment is described.

The non-contact power supply device 100 mainly has a power transmission side coil module 10a and a power receiving side coil module 10b. The power transmission side coil module 10a and the power receiving side coil module 10b each have coils 12a and 12b and the magnetic sheet 2, and correspond to the coil module 10 shown in FIG. 4. Here, in the present embodiment, the magnetic sheet 2 can be mounted on both the power transmission side and the power receiving side as described above, and may also be mounted only on either the power transmission side or the power receiving side. Particularly, the magnetic sheet 2 is preferably used for the power transmission side coil module 10a.

FIG. 5 shows a state in which the power transmission side coil module 10a and the power receiving side coil module 10b are positioned in order to perform non-contact power supply. As shown in FIG. 5, during non-contact power supply, the power transmission side coil 12a and the power receiving side coil 12b are arranged so as to face each other at a predetermined interval. And, the magnetic sheet 2 is arranged so as to cover the back surfaces of the coils 12a and 12b.

The power transmission side coil module 10a is incorporated in a charger side. Besides, a power transmission side internal circuit 20a including an AC/DC converter, an LC resonance circuit and the like is connected to the coil 12a on the power transmission side via the lead terminal 13 (not shown). Furthermore, a power supply 22 is connected to the power transmission side internal circuit 20a. By having the above-mentioned configuration, the coil 12a on the power transmission side is supplied with an alternating voltage having a predetermined frequency during power supply. When an alternating voltage is supplied to the coil 12a on the power transmission side, a magnetic field is generated around the coil 12a.

On the other hand, the power receiving side coil module 10b is incorporated in a charging object such as a mobile terminal or a PC. Similar to the power transmission side, in the power receiving side coil module 10b, a power receiving side internal circuit 20b including a converter, a resonance circuit and the like is connected to the coil 12b on the power receiving side via the lead terminal 13 (not shown). Besides, a secondary battery 24 is connected to the power receiving side internal circuit 20b. When the coil 12b on the power receiving side is brought close to the magnetic field generated on the power transmission side, an alternating current is generated in the coil 12b on the power receiving side by electromagnetic induction. The alternating current generated on the power receiving side is converted into a direct current via the power receiving side internal circuit 20b and used for charging the secondary battery 24.

In the non-contact power supply device 100 as described above, the magnetic sheet 2 is arranged mainly for preventing leakage of magnetic flux and forming a magnetic path. As described in the first embodiment, the magnetic sheet 2 according to the present invention has excellent magnetic permeability characteristics, and thus the non-contact power supply device 100 having the magnetic sheet 2 can efficiently converge the magnetic flux, and the power transmission efficiency is improved.

In addition, in recent years, the non-contact power supply device 100 as shown in FIG. 5 is required to have high output and small size. In order to satisfy these requirements, heat generation during power supply is especially problematic. As described in the first embodiment, the magnetic sheet 2 according to the present invention has a small magnetic loss, and the heat generation of the non-contact power supply device 100 can thus be reduced.

As described above, the non-contact power supply device 100 according to the present embodiment has the magnetic sheet 2 which has excellent magnetic characteristics, and thus the power transmission efficiency can be improved and the size and thickness can be reduced.

Although the embodiments of the present invention have been described above, the present invention is not limited thereto, and various modifications can be made within the scope of the present invention. For example, the non-contact power supply device 100 may have a sensor for detecting the position of the charging object (that is, the power receiving side coil 12b), a drive device for moving the power transmission side coil 12a to the position of the power receiving side coil 12b, or the like, in addition to the above-mentioned constituents.

EXAMPLE

Hereinafter, the present invention is further described based on detailed examples, but the present invention is not limited to these examples.

Experiment 1

In Experiment 1, the magnetic sheet according to Example 1 was prepared by adjusting the firing conditions and the like so that the ratio of the content of Zn in the cross section ($Z_{MIN}/Z_{MAX} \times 100$) is 90% or more. In Example 1, 500 magnetic sheets were prepared, and manufacturing yield rate, initial permeability μi, and magnetic loss Pcv were evaluated. The detailed experimental conditions are described below.

Example 1

First, the raw materials of the main component and the raw materials of the subcomponent were weighed at a predetermined compounding ratio and mixed, and then calcined at 900° C. for 2 hours in an air atmosphere. At this time, powders having an average particle size of 0.1 to 3.0 μm were used as the raw materials of the main component, and were weighted so that the final main component composition was $Fe_2O_3$: 53.5 mol %, ZnO: 10.5 mol %, and the balance MnO. In addition, $SiO_2$, $CaCO_3$, $Nb_2O_5$, and $V_2O_5$ were added as the subcomponents and were blended so that the final content of each subcomponent was $SiO_2$: 0.01 part by weight, CaO: 0.08 part by weight, $Nb_2O_5$: 0.02 part by weight, $V_2O_5$: 0.01 part by weight with respect to 100 parts by weight of the main component.

Next, the calcined material obtained in the previous step was pulverized with a ball mill for 14 hours to obtain a pulverized material having an average particle size of 1.0 to 2.0 μm. Then, the pulverized material was kneaded with a binder, a solvent and the like to obtain a ferrite paste. Then, the ferrite paste was applied onto a carrier tape to form a sheet and thereby green sheets were obtained by the doctor blade method. Moreover, in this molding step, the amount of paste applied was controlled so that the thickness of the magnetic sheet after firing was 100 μm.

Subsequently, the green sheets obtained in the above step were placed on the surface of the setters, and then the setters were put into a continuous firing furnace for firing. At this time, in Example 1, firing was performed under improvement condition shown in Table 1. Specifically, in Example 1, the holding temperature during firing was set to 1200° C. to 1250° C., and the holding time was set to 1 to 2 hours. In addition, the maximum oxygen concentration in the atmosphere was controlled to a range of 0.01 vol % to 4.0 vol % in the temperature rising process from 900° C. to the holding temperature, the temperature holding process from 1200° C. to 1250° C., and the temperature lowering process from the holding temperature to 900° C. Furthermore, a high-purity alumina substrates having a porosity of 12 to 15%, a surface roughness Ra of 1.1 to 1.4 μm and a purity of 99.5% or more were used as the setters.

The magnetic sheets according to Example 1 were obtained by firing under the above conditions. Moreover, each of the manufactured magnetic sheets had a plate shape having a dimension of 100 mm×50 mm in the plan view. In addition, the obtained magnetic sheets were evaluated as shown below.

Line Analysis by EPMA

First, line analysis by EPMA was performed during observation with SEM to evaluate the degree of variation of the Zn component in the thickness direction of the magnetic sheet. Specifically, as shown in FIG. 1, in the cross section of the magnetic sheet, the measurement line 4 (the line length is about the same as the thickness T0 of the magnetic sheet) substantially parallel to the thickness direction was drawn, and component analysis was performed on the measurement line 4 at an intervals of 1 μm in point width to obtain continuous data. At this time, an acceleration voltage was set to 15 kV and an irradiation current was set to 50 nA. In addition, each of the measurement samples were obtained by cutting the magnetic sheet at a substantially central position on the X-Y plane, embedding it in a resin, and mirror-polishing the cross section of the magnetic sheet. The results of line analysis in Experiment 1 were shown in FIG. 2. In addition, the continuous data obtained by line analysis was analyzed, the minimum value $Z_{MIN}$, the maximum value $Z_{MAX}$, the average value $Z_A$, the standard deviation σ, the $Z_{MIN}/Z_{MAX}$, and the $Z_A/Z_T$ were calculated, and the results are shown in Table 2.

Calculation of Manufacturing Yield Rate

The manufacturing yield rate was calculated in order to evaluate the mass productivity of the magnetic sheets according to Example 1. In Example 1, 500 magnetic sheets were prepared, and each of the 500 magnetic sheets was subjected to appearance inspection to evaluate the presence or absence of various defects such as deformation defects, crack defects, fusion defects, or the like. Then, the ratio of the number of non-defective products to the number of manufactured products, that is, the manufacturing yield rate was calculated based on the result of the appearance inspection. The manufacturing yield rate was acceptable when it is 97% or more, and in this case, it is determined that the mass productivity is good. Table 2 shows the calculated manufacturing yield rate.

Evaluation of Magnetic Characteristics

As a preliminary step for evaluating the magnetic characteristics, first, the magnetic sheets of Example 1 were cut into a toroidal shape having an outer diameter of 20 mm and an inner diameter of 10 mm by laser processing. Then, a conductive wire having a wire diameter of 0.35 mm was wound around this evaluation sample for 10 turns, and the initial permeability μi (dimensionless quantity) and the magnetic loss Pcv (unit: kW/m³) were measured.

The initial permeability μi was measured using an LCR meter (Keysight Technologies, Inc.: E4980A). As for the measurement conditions, the measurement temperature was set to room temperature (25° C.) and the measurement frequency was set to 100 kHz. In addition, the initial permeability μi was measured four times, and the average value was calculated. The initial permeability μi is determined to be good when it is 2000 or more, and is determined to be better when it is 2200 or more, with 1800 as a reference value.

The magnetic loss Pcv was measured using a BH analyzer (manufactured by Iwatsu Electric Co., Ltd.: SY-8218). As for the measurement conditions, the measurement temperature was set to room temperature (25° C.), the measurement frequency was set to 100 kHz, and the exciting magnetic flux density was set to 200 mT. The magnetic loss Pcv was measured 8 times and the average value was calculated. The magnetic loss Pcv is determined to be good when it is 800 kW/m³ or less, and is determined to be better when it is 600 kW/m³ or less, with 1000 kW/m³ as a reference value.

Moreover, in the evaluation of the magnetic characteristics, a plurality of magnetic sheets obtained as non-defective products were selected from among the 500 magnetic sheets manufactured in each example and each comparative example, and were used as evaluation samples. Table 2 shows the evaluation results of the magnetic characteristics.

Comparative Example 1

In Comparative example 1, unlike Example 1, firing was performed under conventional condition 1 shown in Table 1 to prepare a magnetic sheet according to Comparative example 1. Specifically, in Comparative example 1, the holding temperature during firing was set to 1300° C. to 1350° C., and the holding time was set to 3 to 5 hours. In addition, the oxygen partial pressure in the firing atmosphere was controlled only in the temperature holding process and the temperature lowering process, and the maximum oxygen concentration at that time was set to 0.03 vol % to 3.0 vol %. In addition, an alumina substrate having a porosity of 30 to 32%, a surface roughness Ra of 2.1 to 2.6 μm and a purity of about 95% was used as the setter. The other experimental conditions in Comparative example 1 were the same as those in Example 1, and the same evaluations as in Example 1 were carried out.

Comparative Example 2

In Comparative example 2, firing was performed using a dummy member (conventional condition 2) to prepare a magnetic sheet according to Comparative example 2. Specifically, in Comparative example 2, a block of zinc oxide being a dummy member was placed around the green sheet and fired. The other firing conditions (holding temperature, holding time, oxygen concentration, setter characteristics, and the like) in Comparative example 2 were the same as those in Comparative example 1.

TABLE 1

| Condition No. | Temperature control | | Atmosphere control | | Dummy member Whether to use | Characteristics of setter | | |
|---|---|---|---|---|---|---|---|---|
| | Holding temperature °C | Holding time h | Oxygen concentration range vol % | Temperature range having controlled oxygen partial pressure — | | Material — | Porosity % | Roughness (Ra) μm |
| Conventional condition 1 | 1300~1350 | 3~5 | 0.03~3.0 | Temperature holding process, temperature lowering process | Not used | Alumina | 30~32 | 2.1~2.6 |
| Conventional condition 2 | 1300~1350 | 3~5 | 0.03~3.0 | Temperature holding process, temperature lowering process | Use | Alumina | 30~32 | 2.1~2.6 |
| Improvement condition | 1200~1250 | 1~2 | 0.01~4.0 | Temperature rising process, temperature holding process, temperature lowering process | Not used | High-purity alumina | 12~15 | 1.1~1.4 |

TABLE 2

| Sample No. | Composition of main components (charged amount) | | | Average thickness of magnetic sheet (T0) μm | Line analysis result | | | | $Z_{MIN}/Z_{MAX}$ % | $Z_A/Z_T$ — | Evaluation characteristics | | |
|---|---|---|---|---|---|---|---|---|---|---|---|---|---|
| | $Fe_2O_3$ mol % | ZnO ($Z_T$) mol % | MnO mol % | | Minimum value ($Z_{MIN}$) mol % | Maximum value ($Z_{MAX}$) mol % | Average value ($Z_A$) mol % | Standard deviation (σ) mol % | | | Yield rate % | Initial permeability — | Magnetic loss kW/m³ |
| Comparative example 1 | 53.5 | 10.5 | 36.0 | 100 | 8.5 | 10.4 | 9.60 | 0.38 | 81.7 | 0.91 | 57.4 | 1541 | 1268 |
| Comparative example 2 | 53.5 | 10.5 | 36.0 | 100 | 8.5 | 10.4 | 9.70 | 0.46 | 81.7 | 0.92 | 68.8 | 1795 | 1087 |
| Example 1 | 53.5 | 10.5 | 36.0 | 100 | 9.8 | 10.8 | 10.30 | 0.19 | 90.7 | 0.98 | 98.6 | 2240 | 606 |

Evaluation 1

In FIG. 2, the solid line ex1 represents the line analysis result of Example 1, a dotted line ce1 represents the line analysis result of Comparative example 1, and a dashed line ce2 represents the line analysis result of Comparative example 2. In Comparative example 1, the content of Zn was significantly reduced from the target value (10.5 mol %) on both the surface side and the setter side. In addition, in Comparative example 2, although the decrease in the content of Zn on the surface side is suppressed to some extent due to the dummy member, the content of Zn was significantly decreased on the setter side. As a result, in Comparative examples 1 and 2, the variation of the Zn component in the thickness direction was large, and $Z_{MIN}/Z_{MAX}$ was less than 90%.

In contrast, in Example 1, the decrease in the content of Zn was suppressed not only on the surface side but also on the setter side, and a magnetic sheet having a $Z_{MIN}/Z_{MAX}$ of 90% or more was obtained. In Example 1, it could be confirmed that defects (deformation defects, crack defects, fusion defects, and the like) scarcely occur after firing, and the manufacturing yield rate was greatly improved as compared with Comparative example 1 and Comparative example 2. From this result, it is proved that the magnetic sheet having a $Z_{MIN}/Z_{MAX}$ of 90% or more can be industrially and stably manufactured.

In addition, as shown in Table 2, in Example 1, the magnetic characteristics were far superior to those in Comparative example 1 and Comparative example 2, and the reference values of the initial permeability μi and the magnetic loss Pcv were satisfied. That is, it is proved that the magnetic sheet having a $Z_{MIN}/Z_{MAX}$ of 90% or more has excellent mass productivity and high magnetic characteristics.

Experiment 2

Examples 11 to 16

In Experiment 2, magnetic sheets according to Examples 11 to 16 were prepared by changing the average thickness T0 of the magnetic sheets. In particular, in Examples 11 to 12, the thickness of the obtained magnetic sheets were adjusted by forming the green sheet by the doctor blade method in the same manner as in Experiment 1 and changed the amount of ferrite paste applied at that time. On the other hand, in Examples 13 to 16, the thickness of the obtained magnetic sheets were adjusted by forming the green sheet by the extrusion molding method and changed the diameter (extrusion diameter) of the mold used at that time. Table 3 shows the average thickness T0 in each of Examples 11 to 16. Moreover, the other experimental conditions in Experiment 2 were the same as those in Experiment 1, and the same evaluations as in Experiment 1 were carried out.

Comparative Examples 11 to 15

In Comparative examples 11 to 15, magnetic sheets having different average thicknesses T0 were manufactured by changed the molding conditions. Table 3 shows the average thicknesses T0 in Comparative examples 11 to 15. The other experimental conditions in Comparative examples 11 to 15 were the same as those in Comparative example 1 in Experiment 1.

Evaluation 2

Table 3 shows the evaluation results of Examples 11 to 16 and Comparative examples 11 to 15 in Experiment 2.

TABLE 3

| Sample No. | Composition of main components (charged amount) | | | Average thickness of magnetic sheet (T0) μm | Line analysis result | | $Z_{MIN}/Z_{MAX}$ % | Yield rate % | Evaluation characteristics | |
|---|---|---|---|---|---|---|---|---|---|---|
| | $Fe_2O_3$ mol % | ZnO ($Z_T$) mol % | MnO mol % | | Minimum value ($Z_{MIN}$) mol % | Maximum value ($Z_{MAX}$) mol % | | | Initial permeability — | Magnetic loss $kW/m^3$ |
| Comparative Example 11 | 53.5 | 10.5 | 36.0 | 50 | 8.3 | 10.2 | 81.3 | 69.6 | 1628 | 1005 |
| Comparative Example 12 | 53.5 | 10.5 | 36.0 | 100 | 8.5 | 10.4 | 81.7 | 57.4 | 1541 | 1268 |
| Comparative Example 13 | 53.5 | 10.5 | 36.0 | 2500 | 8.3 | 10.6 | 78.7 | 95.6 | 2274 | 355 |
| Comparative Example 14 | 53.5 | 10.5 | 36.0 | 2600 | 8.7 | 10.6 | 82.1 | 97.4 | 2297 | 362 |
| Comparative Example 15 | 53.5 | 10.5 | 36.0 | 5000 | 8.5 | 10.8 | 79.1 | 98.6 | 2554 | 328 |
| Example 11 | 53.5 | 10.5 | 36.0 | 50 | 9.6 | 10.4 | 91.8 | 97.4 | 1834 | 754 |
| Example 12 | 53.5 | 10.5 | 36.0 | 100 | 9.8 | 10.8 | 90.7 | 98.6 | 2240 | 606 |
| Example 13 | 53.5 | 10.5 | 36.0 | 500 | 9.9 | 10.6 | 93.6 | 98.6 | 2326 | 513 |
| Example 14 | 53.5 | 10.5 | 36.0 | 1000 | 9.7 | 10.6 | 91.9 | 99.0 | 2268 | 465 |
| Example 15 | 53.5 | 10.5 | 36.0 | 2000 | 9.9 | 10.8 | 92.1 | 99.4 | 2210 | 443 |
| Example 16 | 53.5 | 10.5 | 36.0 | 2500 | 10.1 | 10.8 | 93.7 | 99.4 | 2037 | 365 |

Comparison of the Comparative examples 11-15 shows that the manufacturing yield rate was deteriorated and the magnetic characteristics were also deteriorated, especially in Comparative examples 11 and 12 in which the thickness T0 is thin. From this result, it could be confirmed that the deformation and cracks after firing and the defects due to fusion were prone to occur as the thickness of the magnetic sheet decreases. In addition, in Comparative example 13, although the magnetic characteristics of the sample obtained as a non-defective product were ensured, the manufacturing yield rate was 97% or less, and the mass productivity was poor. When the thickness of the sheet is 2.0 mm or more as in Comparative example 13, the magnetic characteristics of the sheet obtained as a non-defective product could be ensured to some extent by optimizing the firing temperature or the like. However, improvement in mass productivity cannot be realized.

In contrast, in Examples 11 to 16 of the present invention, the $Z_{MIN}/Z_{MAX}$ was 90% or more when the T0 is 1.0 mm to 2.5 mm (Examples 14 to 16) as well as when the T0 is as thin as 50 μm to 1.0 mm or less (Examples 11 to 13). And therefore high manufacturing yield rate and stable manufacturing could be realized. In addition, Examples 11 and 12 had a higher initial permeability μi and a smaller magnetic loss Pcv than Comparative examples 11 and 12. From this result, it could be confirmed that in the magnetic sheet having $Z_{MIN}/Z_{MAX}$ of 90% or more, mass productivity could be ensured and high magnetic characteristics can be obtained even if the thickness is reduced.

Note that, the results of Comparative examples 14 and 15 are supplemented. In Comparative examples 14 and 15, the results show that although the $Z_{MIN}/Z_{MAX}$ was less than 90%, the manufacturing yield rate was high and the magnetic characteristics were also high. It is considered that when the thickness T0 exceeds 2.5 mm, the magnetic sheet becomes a lump shape rather than a sheet shape, the ratio of the plane to the volume decreases, and as a result, mass productivity can be maintained even if the $Z_{MIN}/Z_{MAX}$ is less than 90%.

Experiment 3

In Experiment 3, the magnetic sheets according to Examples 21 to 23 were prepared by changing the composition ratio of the main components. Table 4 shows the composition of the main components in each of Examples 21 to 23. Moreover, the other experimental conditions in Experiment 3 were the same as those in Experiment 1, and the same evaluations as in Experiment 1 were carried out.

Evaluation 3

Table 4 shows the evaluation results of Examples 21 to 23 in Experiment 3.

TABLE 4

| Sample No. | Composition of main components | | | Average thickness of magnetic sheet (T0) μm | Line analysis result | | $Z_{MIN}/Z_{MAX}$ % | Yield rate % | Evaluation characteristics | |
|---|---|---|---|---|---|---|---|---|---|---|
| | $Fe_2O_3$ mol % | ZnO mol % | MnO mol % | | Minimum value ($Z_{MIN}$) mol % | Maximum value ($Z_{MAX}$) mol % | | | Initial permeability — | Magnetic loss $kW/m^3$ |
| Example 21 | 51.0 | 18.0 | 31.0 | 100 | 16.6 | 18.4 | 90.2 | 97.6 | 2953 | 987 |
| Example 22 | 53.5 | 10.5 | 36.0 | 100 | 9.8 | 10.8 | 90.7 | 98.6 | 2240 | 606 |
| Example 23 | 58.0 | 3.0 | 39.0 | 100 | 2.9 | 3.2 | 90.6 | 99.2 | 1823 | 502 |

As shown in Table 4, it could be confirmed that stable manufacturing could be realized even when the ratio of the main components was changed, as long as the $Z_{MIN}/Z_{MAX}$ is controlled within the predetermined range. Moreover, when comparing Examples 21 to 22, it could be confirmed that when the blending ratio of ZnO increases, the initial permeability μi was improved, but the magnetic loss Pcv was greater. In addition, it could also be confirmed that when the blending ratio of ZnO decreases, the magnetic loss Pcv could be reduced, but the initial permeability μi was rather reduced. As for the composition of Mn—Zn ferrite, when $Fe_2O_3$ is in the range of 51 to 58 mol % and ZnO is in the range of 3 to 18 mol %, stable manufacturing could be realized and excellent magnetic characteristics could be obtained.

NUMERICAL REFERENCES

2 .... Magnetic sheet
2a ... Front surface
2b .... Back surface
3 ... Green sheet
4a ... Surface layer side measurement point
4b ... Center side measurement point
6 ... Setter
6a .... Surface of the Setter
10 ... Coil module
12 ... Coil
13 ... Lead terminal
100 ... Non-contact power supply device
10a .... Power transmission side coil module
10b .... Power receiving side coil module
20a .... Power transmission side internal circuit
20b ... Power receiving side internal circuit
22 ... Power supply
24 ... Secondary battery

What is claimed is:

1. A magnetic sheet comprising of a sheet-shaped sintered body,
wherein the sintered body contains Mn—Zn ferrite as a main component,
the Mn—Zn ferrite contains iron oxide in an amount of 51 to 58 mol % in terms of $Fe_2O_3$, zinc oxide in an amount of 3 to 18 mol % in terms of ZnO, and the balance is composed of manganese oxide (MnO), and
a ratio of $Z_{MIN}$ to $Z_{MAX}$ ($Z_{MIN}/Z_{MAX} \times 100$) is 90% or more, in which a maximum value of a content of Zn in terms of oxide is set to $Z_{MAX}$ and a minimum value of the content of Zn in terms of oxide is set to $Z_{MIN}$ in a thickness direction of a cross section of the sintered body.

2. The magnetic sheet according to claim 1, wherein an average thickness of the sintered body is 2500 μm or less.

3. The magnetic sheet according to claim 1, wherein a standard deviation of the content of Zn in terms of oxide in the thickness direction of the cross section of the sintered body is 0.3 mol % or less.

4. A coil module comprising the magnetic sheet according to claim 1.

5. A non-contact power supply device comprising the coil module according to claim 4.

6. The magnetic sheet according to claim 1, which has a front surface and a back surface, wherein the front surface or the back surface has an area of 2000 $mm^2$ or more.

7. The magnetic sheet according to claim 6, wherein the area is 5000 $mm^2$ to 10000 $mm^2$.

8. The magnetic sheet according to claim 2, wherein the average thickness is 50 μm to 2500 μm.

9. The magnetic sheet according to claim 8, wherein the average thickness is 100 μm to 2000 μm.

10. The magnetic sheet according to claim 8, wherein the average thickness is 100 μm to 1000 μm.

11. The magnetic sheet according to claim 6, wherein the ratio (area/volume) of an area of the front surface or the back surface to a volume of the magnetic sheet is 0.4 $mm^{-1}$ or more.

12. The magnetic sheet according to claim 11, wherein the ratio is 0.5 $mm^{-1}$ or more.

13. The magnetic sheet according to claim 11, wherein the ratio is 1 $mm^{-1}$ or more.

14. The magnetic sheet according to claim 1, which has an initial permeability μi of 1800 or more.

15. The magnetic sheet according to claim 14, wherein the initial permeability μi is 2000 or more.

16. The magnetic sheet according to claim 14, wherein the initial permeability μi is 2200 or more.

17. The magnetic sheet according to claim 1, which has a magnetic loss of 1000 $kW/m^3$ or less.

18. The magnetic sheet according to claim 17, wherein the magnetic loss is 800 $kW/m^3$ or less.

19. The magnetic sheet according to claim 17, wherein the magnetic loss is 600 $kW/m^3$ or less.

* * * * *